United States Patent [19]

Haghiri-Tehrani

[11] Patent Number: 5,756,379

[45] Date of Patent: May 26, 1998

[54] METHOD AND APPARATUS FOR MAKING AN ELECTRONIC MODULE FOR CARDS

[75] Inventor: Yahya Haghiri-Tehrani, Munich, Germany

[73] Assignee: Giesecke & Devrient GmbH, Munich, Germany

[21] Appl. No.: 288,042

[22] Filed: Aug. 10, 1994

[30] Foreign Application Priority Data

Aug. 10, 1993 [DE] Germany ............... 43 26 816.1

[51] Int. Cl.[6] ........................................... H01L 21/60
[52] U.S. Cl. ........................... 438/126; 438/125; 438/127
[58] Field of Search ........................... 437/209, 211, 437/214, 217, 218, 219, 220; 438/126, 125, 127

[56] References Cited

U.S. PATENT DOCUMENTS 4,674,175  6/1987  Stampfli .
5,102,828  4/1992  Marchisi ........................... 437/211
5,304,513  4/1994  Haghiri-Tehrani et al. ............ 437/214

FOREIGN PATENT DOCUMENTS 34 24 241 C2  1/1985  Germany .

*Primary Examiner*—Kevin Picardat
*Attorney, Agent, or Firm*—Bacon & Thomas

[57] ABSTRACT

A method of making an electronic module with an integrated circuit includes beginning with a standardized starting product in the form of an insulating substance bearing a conductive coating. Contact surfaces are formed in the conductive coating by interruptions in the insulating substance. Using milling cutter one provides the insulating layer of the starting product with variable patterns of recesses through which conductive connections between the contact surfaces and the integrated circuit are later guided. The position of the recesses is varied in accordance with the size of the integrated circuit to be incorporated in the electronic module.

10 Claims, 3 Drawing Sheets

METHOD AND APPARATUS FOR MAKING AN ELECTRONIC MODULE FOR CARDS

BACKGROUND OF THE INVENTION

The invention relates to a method for producing an electronic module for data carriers with at least one integrated circuit, having contact surfaces for communication of the integrated circuit with external devices and having an electrically insulating layer which is located on the contact surfaces on the side facing the integrated circuit and has recesses for electrically connecting the contact surfaces with the electric circuit. The invention also relates to modules produced by this method.

RELATED TECHNOLOGY

U.S. Pat. No. 4,674,175 already discloses a method for producing electronic modules wherein a metal band provided with a multiplicity of round openings is first prepared. Two opposite rows of metal tongues protrude into each opening, a wafer made of electrically insulating material being fastened thereto in such a way that recesses located within the wafer lead onto the metal tongues. In the center of the wafer between the rows of metal tongues there is a receiving space in which an integrated circuit is incorporated and electrically connected with the metal tongues, the conductive connections being guided through the recesses in the wafer. The integrated circuit and conductive connections are then cast with a casting compound. The wafer serves as a flow stop for the casting compound in the direction of the metal tongues so that no casting compound can flow onto the metal tongues. Finally the finished module is stamped out of the metal band. The metal tongues located on the surface of the module serve as contact surfaces.

The method presented in U.S. Pat. No. 4,674,175 permits the production of flat electronic modules since the integrated circuit is incorporated in a receiving space in the wafer.

The wafer itself is made of a synthetic material and produced by injection molding, the recesses for guiding through the conductive connections and the receiving space for the integrated circuit already being taken into consideration during injection molding.

A method for producing electronic modules wherein a carrier film is first prepared is further known from German Patent No. 3,424,241 for example. Recesses for guiding through conductive connections and a recess for receiving an integrated circuit are stamped in this carrier film. The carrier film is then provided with a conductive coating in which contact surfaces are formed by interruptions in such a way that the recesses for guiding through the conductive connections are located below the contact surfaces and lead onto them. Part of the conductive coating remains between the contact surfaces to cover the recess for the circuit in the direction of the contact surfaces. In a further step the integrated circuit is incorporated in the intended recess and glued onto the part of the conductive coating located between the surrounding contact surfaces. Finally the circuit is connected electrically with the contact surfaces, the connections being guided through the surrounding recesses. Here too the circuit and the conductive connections are cast with a casting compound. The carrier film serves as a flow stop for the casting compound in the direction of the contact surfaces.

It has turned out that there is an optimal position for the recesses in the insulating layer (or wafer or carrier film) to permit electric access to the contact surfaces for different types of integrated circuit and for integrated circuits of different sizes depending on the interconnection system between the terminals of the circuit and the contact surfaces. If the integrated circuit is located in a recess the latter must be adapted in its dimensions to the size of the particular circuit. This means that corresponding injection molding tools for producing the wafer or corresponding stamping dies for stamping the recesses in the carrier film must be provided in known methods for each circuit and for circuits of different sizes to permit production of a wafer optimally adapted to the particular circuit or an optimally adapted carrier film. This not only impairs the flexibility of producing electronic modules but also leads to corresponding costs due to the production of the particular new tools, which are reflected in the costs for the electronic module.

The invention is therefore based on the problem of providing a method for producing electronic modules that permits a cost-effective production of the module while involving high flexibility with respect to the use of different integrated circuits.

BRIEF SUMMARY OF THE INVENTION

The basic idea of the invention is to provide a standardized starting product comprising an electrically insulating layer bearing a contact layout of any desired design. Depending on the type of circuit to be processed, at least the recesses necessary for electrically connecting the circuit with the contact surfaces are the produced in the insulating layer of the starting product.

It is essential for success that the recesses be produced in the standardized starting product by a technique that permits the position of the recesses to be adapted easily to different circuits using the same tooling.

The advantages obtained by the invention are in particular that the production of electronic modules with different circuits can be designed much more flexibly by the use of a standardized starting product. The position of the recesses to be produced can be adapted particularly easily using a program-controlled tool since one need only change the control program for the tool to produce recesses differing in position. This involves little effort. One need thus provide only one tool to produce different modules.

Also the standard product can be produced in large quantity since it is the same for all types of integrated circuits to be incorporated in the module. It follows from all this that the use of a standardized starting product in which the recesses are produced by a program-controlled tool permits a more cost-effective production of electronic modules.

According to a preferred embodiment of the invention the recesses for electrically connecting the circuit with the contact surfaces are produced in the insulating layer of the starting product by a program-controlled milling cutter. In the control portion of the milling cutter one can store several programs for different types of circuit and thus for differently situated recesses to be used as control programs for the tool if required. Furthermore it is possible to mill into the contact surfaces when producing the recesses in the insulating layer, thereby ensuring that a noncorroded area is obtained on the contact surfaces, which considerably simplifies the production of a conductive transition between the contact surfaces and the conductive connections between the contact surfaces and the circuit.

BRIEF DESCRIPTIONS OF THE DRAWINGS

Further embodiments and advantages of the invention can be found in the subclaims and the following description with reference to the drawings, in which:

DETAILED DESCRIPTION

Figure 1:
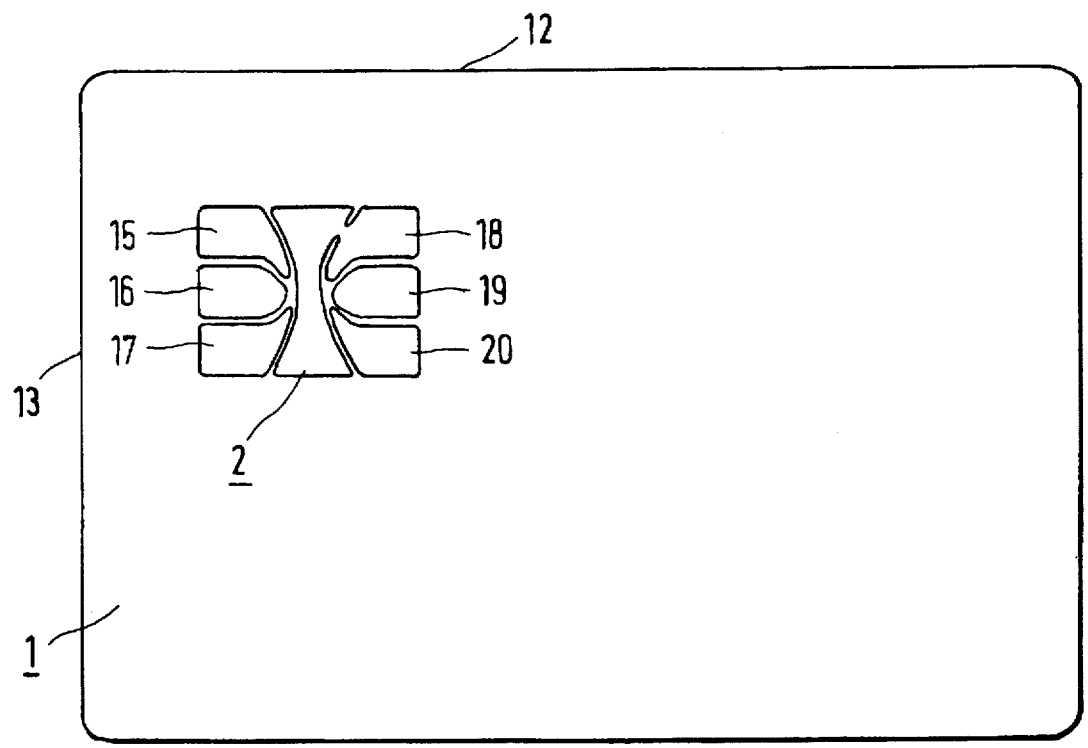
FIG. 1 shows an identity card from the front.

FIG. 1 shows an identity card with incorporated electronic module 2 from the front. Electronic module 2 bears contact surfaces 15 to 20 that together form a contact layout that may be designed in virtually any desired way. When the identity card is inserted into an external device for communication therewith it is positioned there in such a way that the contact pins lie on defined areas of contact surfaces 15 to 20.

Figure 2:
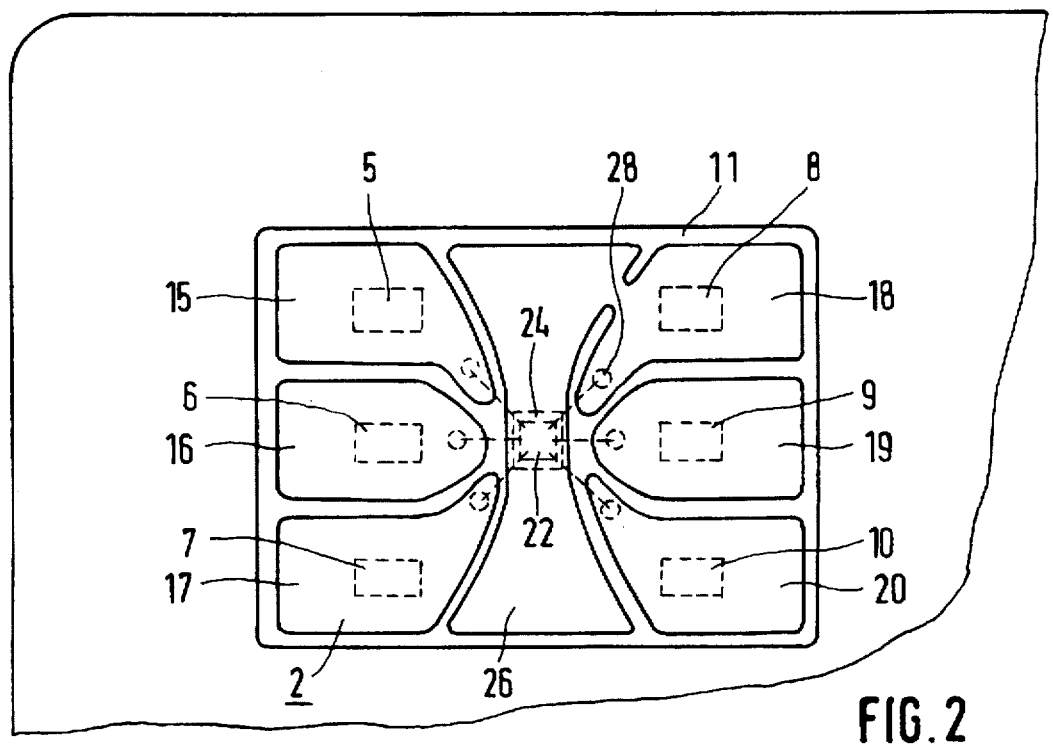
FIG. 2 shows a detail of FIG. 1 from the front.

FIG. 2 shows an enlarged, not true-to-scale detail from FIG. 1 with an exemplary design of the surface of electronic module 2. Insulating layer 11 of module 2 is virtually covered with a conductive coating in which contact surfaces 15 to 20 are formed by interruptions. Conductive surfaces 5 to 10 necessary for contacting in an external device are shown in contact surfaces 15 to 20 by broken lines. Integrated circuit 22 of module 2 is located within recess 24 in insulating layer 11 that is covered in the direction of the contact surfaces by bar 26 located between the contact surfaces. Below each of contact surfaces 15 to 20 the insulating layer has recess 28 through which a conductive connection is guided from circuit 22 to the corresponding contact surface in each case. The position of recesses 28 is dependent on the size of circuit 22 and on the way the conductive connections between circuit 22 and contact surfaces 15 to 20 are produced.

Figure 3:
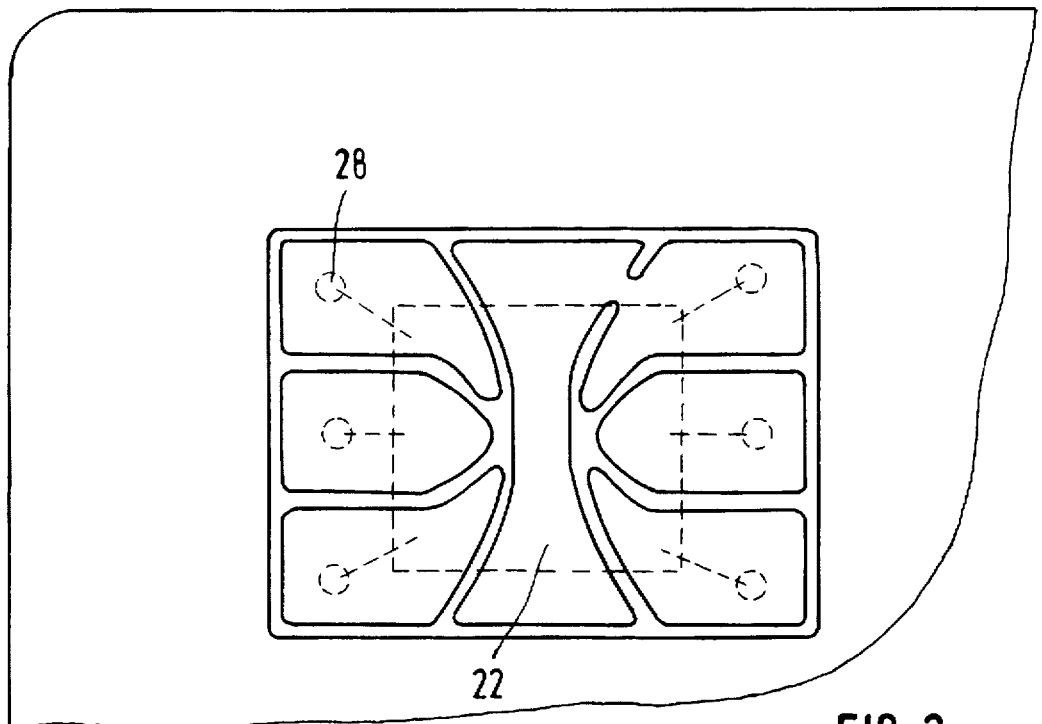
FIG. 3 shows a detail of FIG. 1 from the front.

FIG. 3 shows virtually the same module as FIG. 2. However integrated circuit 22 incorporated in electronic module 2 is formed much larger here than that shown in FIG. 2. Recesses 28 are accordingly closer to the outer edge of the contact layout than in FIG. 2. The circuit is also located in a recess here, but the recess has a thin bottom that covers the recess in the direction of the contact surfaces. Both in FIG. 2 and in FIG. 3 recesses 28 are located, not directly below conductive surfaces 5 to 10 necessary for contacting in an external device, but rather in an area that arises from the arbitrary design of contact surfaces 15 to 20.

Figure 4:
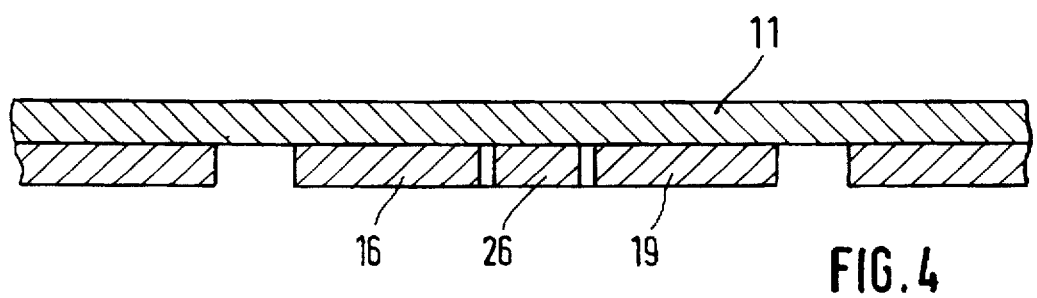
FIG. 4 shows a standardized starting product in cross section.

FIG. 4 shows the standardized starting product in an endless form in cross section. The starting product comprising insulating layer 11 bearing the contact layout can be produced in various ways. For example insulating layer 11 can exist as an endless carrier film that is first provided with an all-over conductive coating in which the contact layout is formed by interruptions (e.g. produced by etching). Corresponding methods are known and need not be explained in any detail here. The carrier film can e.g. correspond virtually to a usual commercial film that has perforations on the edge to be used for transporting the film to the various processing units. However one can also use a carrier film that has no perforations.

It is also possible to provide a perforated metal band first and produce the contact layout therein by stamping, the layout first remaining connected with the band via thin bars.

The thus prepared metal band is now provided all over or in part with insulating layer 11. This layer can be glued or sprayed on, for example, and be formed very thin since in this case the metal band can be used as a means of transport to the various processing units.

Figure 5:
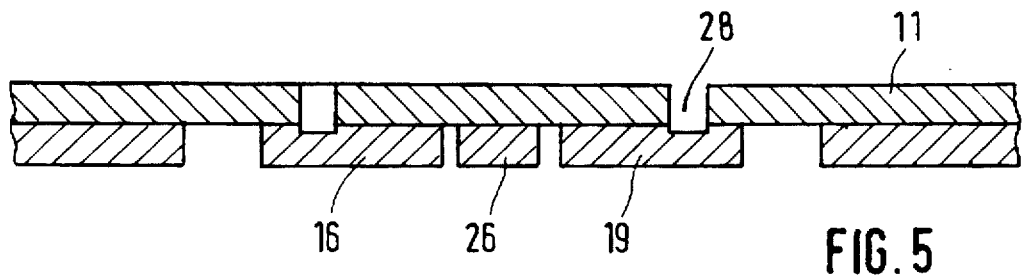
FIG. 5 shows a standardized starting product in cross section with milled-in recesses.

Recesses 28 that lead onto the contact surfaces are produced in the standardized starting product with the aid of a milling cutter, as FIG. 5 shows. One mills slightly into the contact surfaces so that areas arise there that are definitely noncorroded. Depending on the type of circuit to be incorporated in the module, recesses 28 have a different position (see also FIGS. 2 and 3). The area in which the milling cutter produces recesses 28 is fixed by the control program which controls the milling cutter. Recesses 28 can of course also be produced in insulating layer 11 by another tool, e.g. with the aid of a drill or laser, the only important thing being that the tool used is controlled by a program. At the edge of the standardized starting product perforations can also be milled in addition to recesses 28 to be used later for transporting the starting product to the various processing units. Simultaneous production of recesses 28 and the perforations has the advantage that the perforations are located in the correct position with respect to recesses 28 and the starting product can later be positioned very precisely. The same effect is obtained of course by producing the perforations in the first processing unit by stamping.

Figure 6:
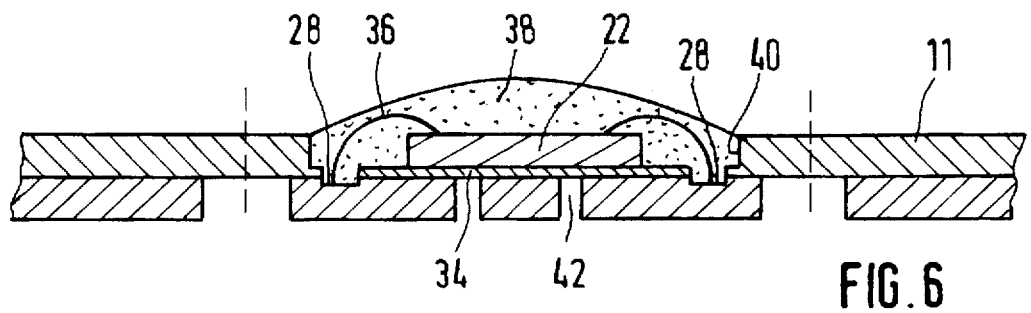
FIG. 6 shows a finished module in cross section.

FIG. 6 shows the finished module in cross section. Integrated circuit 22 is glued in recess 32, which is likewise produced by milling, and conductive connections 36 are then produced between integrated circuit 22 and the contact surfaces, being guided through recesses 28 onto the noncorroded contact surfaces. This virtually ensures a conductive transition between conductive connections 36 and the contact surfaces. In the example shown conductive connections 36 are formed as bonding wires but they can also be produced in other ways, for example by a metal spider or conductive contact bumps located on the integrated circuit and made of a conductive plastic or conductive adhesive or lacquer. Finally recess 32 is cast with casting compound 38 to protect circuit 32 and bonding wires 36 from mechanical loads. Lateral limit 40 of the recess serves here as a limiting frame for the casting compound, thereby preventing the as yet unhardened casting compound from flow laterally onto the insulating layer. The casting compound is prevented from flowing through gaps 42 in the direction of the contact surfaces by bottom 34 of recess 32.

Since bottom 34 only serves as a flow stop for the casting compound it can have an extremely small residual thickness of a few microns. Such thin bottoms are particularly easy to produce using a milling cutter since the milling accuracy is within the range of a few microns. One can thus produce electronic modules with an extremely low overall height. If insulating layer 11 has an extremely small thickness from the beginning one can dispense with recess 32 and glue the circuit directly to the layer.

Figure 7:
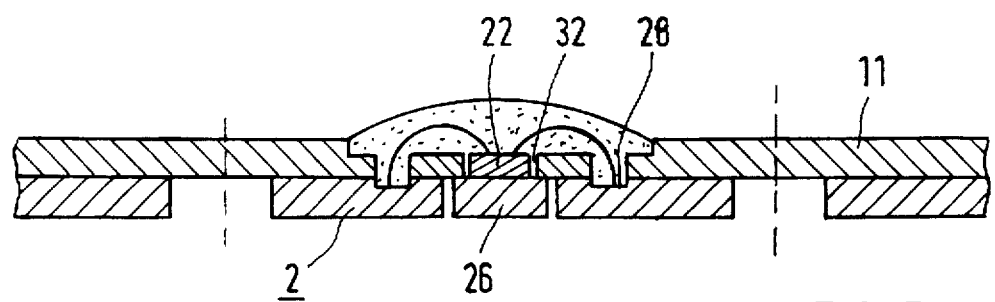
FIG. 7 shows a finished module in cross section.

FIG. 7 shows an electronic module with small integrated circuit 22 as already shown in FIG. 2 from the front. Electronic module 2 is produced virtually just like the module shown in FIG. 6. One thus again begins with the starting product shown in FIG. 4 in which windows 28 are milled for guiding through the conductive connections from the circuit to the contact surfaces and, if required (i.e. if a thick insulating layer is present), recess 32 for circuit 22. For small circuits 22 recess 32 can be formed without a bottom since recess 32 is covered in the direction of the contact surfaces by bar 26. It is possible to mill into bar 26 when producing recess 32, thereby further reducing the overall height of the finished module. If the integrated circuit is so large that it is partly located below surfaces 5 to 10 necessary for contacting, bar 26 cannot be used as a bottom for recess 32 since it must be insulated from these surfaces and can thus not be made wide enough (see also FIG. 3).

When producing module 2 shown in FIG. 7 one need only use a different control program for the milling cutter since recesses 28 have a different position compared to the module shown in FIG. 6. After the recesses are produced in insulating layer 11 the module shown in FIG. 7 is finished just like that shown in FIG. 6.

Figure 8:
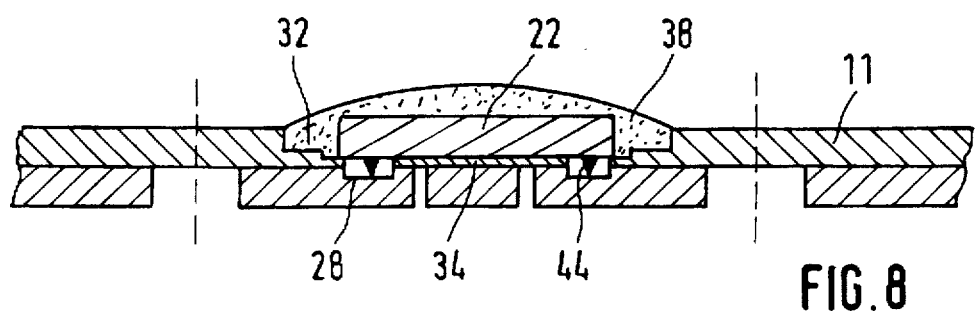
FIG. 8 shows a finished module in cross section.

FIG. 8 shows an electronic module with an integrated circuit on which contact bumps are located for producing the conductive connections with the contact surfaces. This module is also produced virtually just like the module shown in FIG. 6. One thus begins with the starting product shown in FIG. 4 in which windows 28 and, if required, recess 32 for circuit 22 are milled. Circuit 22 is inserted in recess 32 in such a way that contact bumps 44 protrude through recesses 28 in insulating layer 11 and come to lie on the contact surfaces. Bottom area 34 of recess 32 can again be made extremely thin so that contact surfaces 44 need only have a small height to be able to be guided through windows 28 onto the contact surfaces. After circuit 22 is incorporated in the recess the circuit is cast with casting compound 38. The finished module is of small overall height.

Figure 9:
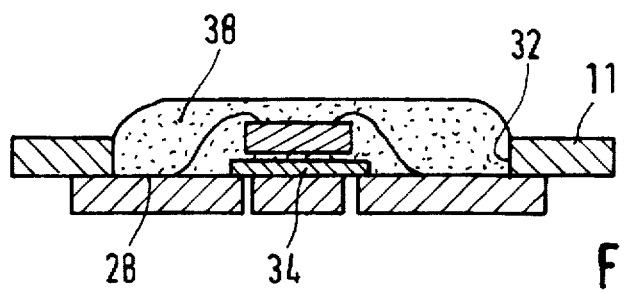
FIG. 9 shows a finished module in cross section.

FIG. 9 shows an electronic module that is likewise produced virtually like the module shown in FIG. 6. One thus likewise begins with the starting product shown in FIG. 4, milling recess 32 in insulating layer 11 thereof so as to leave only bottom 34 of small residual thickness. Recesses 28 are also milled in for guiding through the conductive connections from the circuit to the contact surfaces. Recesses 28 are produced in such a way that a maximally large surface to the contact surfaces is free from the material of insulating layer 11, i.e. the recesses are produced as near to the circuit as possible and end at the outer edge of recess 32. This makes casting compound 38 fairly thick and inherently stable in a large area, namely in the area of recess 28, and results in a good bond between the casting compound and the metal layer of the contact surfaces.

It is particularly advantageous if insulating layer 11 is formed from a material that can be connected directly, without additional adhesive, with the material of the card body in which the electronic module is incorporated. Materials to be used are e.g. PVC, ABS or PC layers that can be connected directly with the card body upon lamination of the card layers of a body. However it is also possible to form the insulating layer as a thermoactivated adhesive layer. In this case the adhesive layer can be activated by the supply of heat upon insertion of the module in the recess of a card body and the module thus connected with the card body.

As indicated in the Figures, the starting product exists as an endless band or multicopy film. The finished modules must be stamped out of this endless band. FIGS. 6, 7 and 8 show the stamping edges by broken lines. They have the same position in all cases since they are independent of the size of the circuit to be incorporated in the module.

I claim:

1. A method for producing an electronic module for data carriers with at least one integrated circuit, the data carrier including an electrically conductive layer with contact surfaces for communication of the circuit with external devices and having an insulating layer which is connected with the conductive layer, the insulating layer having recesses for receiving conductors for electrically connecting the contact surfaces with the circuit, comprising the steps of:

forming standardized data carrier starting products each comprising an insulating layer with an electrically conductive layer provided thereon without the recesses for receiving the conductors, and then forming a predetermined pattern of recesses in the insulating layer of each starting product for receiving the conductors for connecting the contact surfaces with a circuit, said pattern of recesses varying in accordance with the dimensions of an integrated circuit to be placed on a starting product.

2. The method for producing an electronic module of claim 1, including forming the recesses in the insulating layers by a program-controlled tool.

3. The method for producing an electronic module of claim 2, including using a milling cutter or drilling tool to produce the recesses in the insulating layers.

4. The method for producing an electronic module of claim 3, including milling or drilling partly into the contact surfaces when producing the recesses in the insulating layers.

5. The method for producing an electronic module of claim 2, including using a laser to produce the recesses in the insulating layers.

6. The method for producing an electronic module of claim 1, including producing perforations at the edges of the insulating layers in addition to the recesses for electronically connecting the contact surfaces with the circuits.

7. The method for producing an electronic module of claim 1, including providing recesses for taking up the integrated circuits in the insulating layers in addition to the recesses for electrically connecting the contact surfaces with the circuits.

8. The method for producing an electronic module of claim 7, including milling each recess for taking up the integrated circuit into the insulating layer only deep enough such that a thin bottom of insulating layer material remains.

9. The method for producing an electronic module of claim 7, including milling each recess for taking up the integrated circuit by milling at least as far as the conductive layer.

10. An apparatus for carrying out the method of claim 4, said apparatus comprising program-controlled tooling and including a memory containing programs which control said tooling to produce said recesses in different positions in the insulating layers of starting products, said programs varying the positions of said recesses in accordance with the dimensions of an integrated circuit to be placed on a starting product.

* * * * *